(12) United States Patent
Liu et al.

(10) Patent No.: US 6,255,734 B1
(45) Date of Patent: Jul. 3, 2001

(54) PASSIVATED COPPER LINE SEMICONDUCTOR DEVICE STRUCTURE

(75) Inventors: Chung-Shi Liu; Chen-Hua Yu, both of Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/670,325

(22) Filed: Sep. 27, 2000

Related U.S. Application Data

(62) Division of application No. 09/224,983, filed on Jan. 4, 1999, now Pat. No. 6,130,162.

(51) Int. Cl.[7] .............. H01L 23/48; H01L 23/52
(52) U.S. Cl. ................ 257/762; 257/662; 257/751; 257/758; 257/774; 257/915
(58) Field of Search ................. 257/762, 622, 257/752, 751, 750, 758, 774, 915; 438/618, 626, 627, 637, 668, 687, 643, 652, 658, 705

(56) References Cited

U.S. PATENT DOCUMENTS

| 6,046,108 | * | 4/2000 | Liu et al. ............ 438/687 |
| 6,130,162 | * | 10/2000 | Liu et al. ............ 438/687 |
| 6,143,657 | * | 11/2000 | Liu et al. ............ 438/687 |
| 6,181,013 | * | 1/2001 | Liu et al. ............ 257/762 |

* cited by examiner

Primary Examiner—Matthew Smith
Assistant Examiner—Igwe U. Anya
(74) Attorney, Agent, or Firm—George O. Saile; Stephen B. Ackerman; Graham S. Jones, II

(57) ABSTRACT

A method of forming a copper conductor for a thin film electronic device comprises: forming layers over a conductor into a stack of barrier layer superjacent on top of the substrate, a copper layer on top of the barrier layer, and a hard mask layer on top of the copper layer. The forming a mask on top of the hard mask layer and pattern the stack by etching through the layers down to the substrate on the sides of the mask forming the copper layer into a copper conductor line and leaving sidewalls of the copper conductor line exposed. Grow a copper germanide ($Cu_3Ge$) compound passivation layer is selectively grown only on the sidewalls of the copper conductor line.

8 Claims, 3 Drawing Sheets

PASSIVATED COPPER LINE SEMICONDUCTOR DEVICE STRUCTURE

This is a division of patent application Ser. No. 09/224,983, filing date Jan. 4, 1999, Method Of Preparing Passivated Copper Line And Device Manufactured Thereby, assigned to the same assignee as the presetn invention now U.S. Pat. No. 6,130,162.

BACKGROUND OF THE INVENTION

1. Field of the Invention

This invention relates to copper electrical conductors on a thin film semiconductor device and more particularly to an passivation of an exposed surface of a copper conductor.

2. Description of Related Art

U.S. Pat. No. 5,420,069 of Joshi et al. for "Method of Making Corrosion Resistant, Low Resistivity Copper for Interconnect Metal Lines" shows a copper line with $Cu_3Ge$ layers on the sidewalls and top. It shows a "corrosion resistant thin film interconnect material, comprising a bilayer formed of a copper (Cu) film over which a layer of $Cu_3Ge$ or copper germanium,(Ge) alloy has been deposited." In FIG. 3B, Joshi et al. ". . . shows Cu—Ge passivation layer 180 on all exposed surfaces of copper." This provides "excellent passivation properties". The preferred process described is "selective deposition of germanium over copper surfaces . . . exposing the original Copper (Cu) layer (or surface) at a low pressure (0.5 Torr to 1 Torr) to a source of germanium, e.g. $GeH_4$ gas, in a chemical vapor deposition (CVD) reactor at temperatures ranging from about 200°–450° C. to convert the outer surface of the Cu lines to Cu(x)Ge(y) or $Cu_3Ge$ . . . . Any Ge containing gas source, e.g. $GeH_4$, $GeH_6$ and the like can be used . . . . It is noted that by increasing the partial pressure of $GeH_4$ more than 0.1 Torr, the Cu(x)Ge(y) alloy can be changed to $Cu_3Ge$ or additional Ge can be formed." Copper "rich phases and . . . specifically $Cu_3Ge$ may also be produced by plating (electrolytic and electroless), sintered powder and sputtered bilayers which are subsequently reacted.

U.S. Pat. No. 5,288,456 of Aboelfotoh et al. for "Compound with Room Temperature Electrical Resistivity Comparable to that of Elemental Copper" shows a process for producing copper germanide $Cu_3Ge$ compound on the surface of a silicon substrate which had been treated by evacuation to a pressure of $1\times10^{-7}$ Torr for a period of time following which Ge, Ga and copper were deposited sequentially in an evacuated chamber at room temperature to avoid contact with air or oxygen. A thin film of 700 Å of germanium (Ge) was deposited on a <100> surface of the silicon substrate. Then 5–10 atomic percent of gallium (Ga) was deposited on the Ge film followed by deposition of copper (Cu) to a thickness of about 1300 Å. Then the result of the process to this point is annealed at a temperature of about 400° C. in situ for 30 minutes in vacuum. The result is a thin layer of the $Ge_3Cu$ compound with a thickness of about 2000 Å thickness on the surface which has 1–2% of Ga incorporated therein.

U.S. Pat. No. 5,731,245 of Joshi et al. for "High Aspect Ratio Low Resistivity Lines/Vias with Tungsten Alloy Hard Cap" discusses copper/germanium barrier layers.

U.S. Pat. No. 5,060,050 of Tsuneoka et al. for "Semiconductor Integrated Circuit Device" shows a copper wire process.

Copper, due to the lack of its self-passivation as the result of oxidation, is easily oxidized throughout a copper film which is unsatisfactory for copper conductor lines.

In the past, various techniques for surface-passivation of copper have been proposed.

We find that direct selective CVD growth on the top surface and sidewalls of a copper (Cu) line to form a $Cu_3Ge$ layer thereon will lead to the problem of poor coverage at the top corner.

SUMMARY OF THE INVENTION

This invention teaches the selective growth of a copper germanide ($Cu_3Ge$) compound layer on the sidewalls of a copper (Cu) line, but not on material covering the top of the line which is protected by a cap which does not react with germanium. In addition, preferably, the adhesion layer, upon which the copper line is formed, does not react with germanium when exposed thereto.

In accordance with one aspect of this invention, A method of forming a copper conductor for a thin film electronic device comprises first forming layers over a conductor into a stack, as follows:

a) forming a barrier layer superjacent to the substrate,
b) then forming a copper layer superjacent to the barrier layer,
c) then forming a hard mask layer superjacent to the copper layer,
d) then forming a mask superjacent to the hard mask layer to pattern the stack and etching through the layers down to the substrate on the sides of the mask forming the copper layer into a copper conductor line and leaving sidewalls of the copper conductor line exposed.

Then, a copper germanide ($Cu_3Ge$) compound passivation layer is selectively grown only on the sidewalls of the copper conductor line. The device is exposed to in situ to germane $GeH_4$ gas at a temperature from about 200° C. to about 400° C., in an atmosphere of hydrogen/helium ($H_2/He$) gases to form the copper germanide ($Cu_3Ge$) compound. The barrier layer comprises a material selected from the group consisting of Ta, Ta/TaN, TaN, Ta/TaN/Ta, TaN/Ta, $WN_x$, W, and TiN. The hard mask layer comprises a material selected from the group consisting of Ta, Ta/TaN, TaN, Ta/TaN/Ta, TaN/Ta, $WN_x$, W, and TiN.

In accordance with another aspect of this invention, a copper conductor line formed into a stack over a substrate comprises a barrier layer superjacent to the substrate, a copper layer superjacent to the barrier layer, a hard mask layer superjacent to the copper layer, the hard mask layer, the copper layer and the barrier layer patterned into a copper conductor line with sidewalls on the copper conductor line, and a copper germanide ($Cu_3Ge$) passivation layer selectively grown only on the sidewalls of the copper conductor line.

Preferably, the barrier layer comprises a material selected from the group consisting of Ta, Ta/TaN, TaN, Ta/TaN/Ta, TaN/Ta, $WN_x$, W, and TiN, and the hard mask layer comprises a material selected from the group consisting of Ta, Ta/TaN, TaN, Ta/TaN/Ta, TaN/Ta, $WN_x$, W, and TiN.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1A:
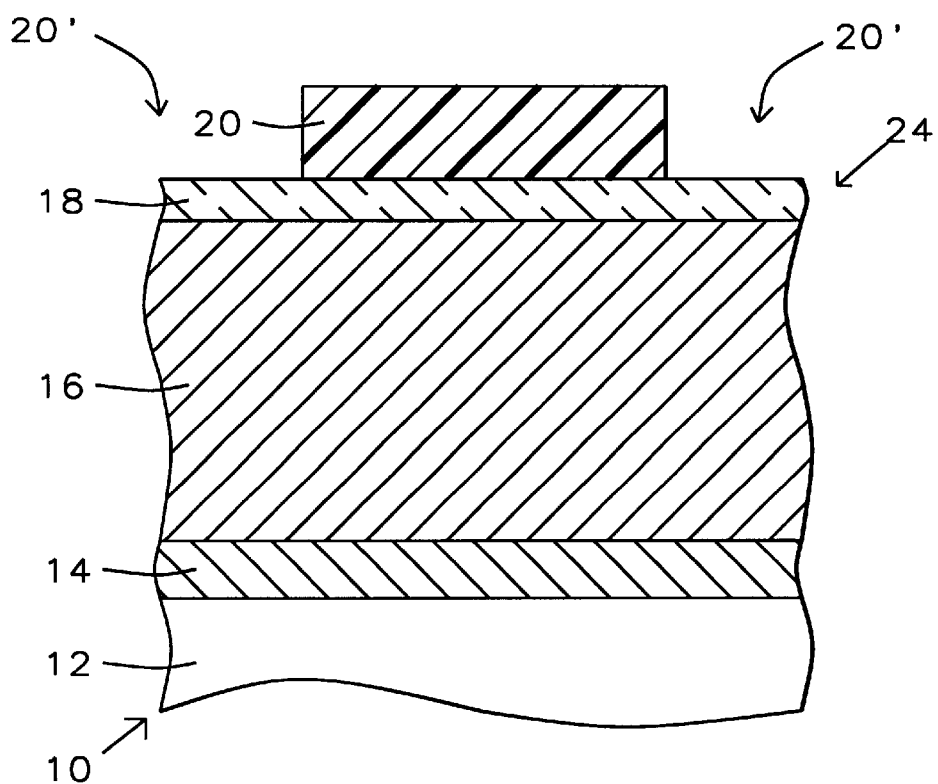
FIGS. 1A–1C show a sectional view of a device in the course of manufacture in accordance with a first embodiment of the method of this invention.
Figure 1B:
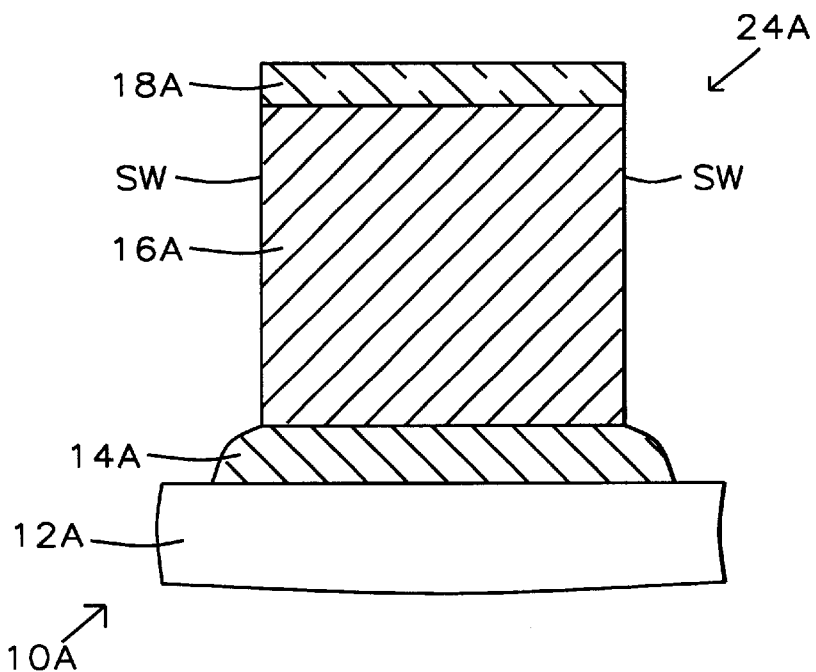
Figure 1C:
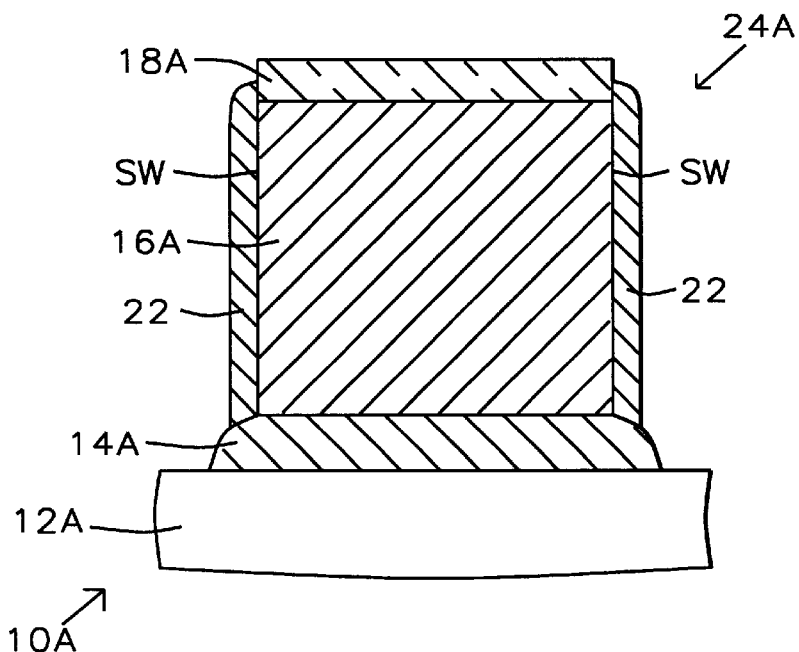

FIGS. 1A–1C show a sectional view of a device in the course of manufacture in accordance with a first embodiment of the method of this invention.

In FIG. 1A, device 10 in accordance with this invention is shown in an intermediate stage of manufacture with a substrate 12. A barrier layer 14 is formed superjacent to the substrate 12 (i.e. covering the top surface of substrate 12). The barrier layer 14 comprises a material selected from the group consisting of Ta (tantalum), Ta/TaN, TaN, Ta/TaN/Ta, TaN/Ta, $WN_x$, W (tungsten), and TiN (titanium nitride).

A copper metal conductor layer 16 is formed superjacent to the barrier layer 14. Over the top surface of the metal conductor layer 16, a hard mask layer 18 is formed. A photoresist mask 20 is formed superjacent to the hard mask layer 18 composed of a material such as a material selected from the group consisting of silicon nitride ($Si_3N_4$) and $Si_3N_4$/SiON. Mask 20 is patterned with openings 20' provided for etching the stack 24 of layers 14/16/18. Thus the hard mask 18 (e.g. $Si_3N_4$) has been used in patterning the copper (Cu) layer 16 to form copper line 16A.

FIG. 1B shows the device 10 of FIG. 1A with the conductor stack 24A of the three layers 14/16/18 of FIG. 1A after patterning by a conventional etching process using the mask 20 to protect the stack 24A formed, as seen in FIG. 1B. Then subsequent to etching, the mask 20 was stripped (removed) from the device 10. During the etching process all the material from layers 14/16/18 is removed below the windows 20' patterning layers 14/16/18 to leave a laminated conductor line 24A formed by barrier layer 14A/conductor line 16A/mask layer 18A.

The problem is that the copper conductor line 16A has exposed sidewalls SW which are likely to be oxidized which can reduce the reliability of the copper conductor line 16A. Thus it is necessary to passivate the copper sidewalls SW of the copper conductor line 16A.

FIG. 1C shows the device 10 of FIG. 1B with the sidewalls SL coated with a copper germanide $Cu_3Ge$ compound passivation layer 22. This structure uses selective growth of passivation layer 22 on the sidewalls SW of copper conductor line 16A to avoid Copper (Cu) oxidation at the top corner of copper germanide ($Cu_3Ge$) compound passivation of line 24A and to increase the reliability thereof by the subsequent process. As can be seen, the formation of copper germanide compound passivation layer 22 is selective in that layer 22 is not formed on the surface of the barrier layer 14A or the hard mask layer 18A.

The selective growth of the copper germanide compound is performed by introducing into the chamber in situ of germane $GeH_4$ gas at a temperature from about 200° C. to about 400° C. to form a copper germanide ($Cu_3Ge$) compound, as copper germanide $Cu_3Ge$ compound passivation layer 22. Growth of the copper germanide compound can be performed following introduction into the chamber containing device 10 of hydrogen/helium ($H_2$/He) gas for reduction of any oxide which exists on the copper conductor 16A juxtaposed with the copper germanide ($Cu_3Ge$) compound, thin film layer 22.

The result of this process is the selective growth of low resistivity (5.5 $\mu$m-cm) of $Cu_3Ge$ layer 22 on the sidewalls SW of copper (Cu) line 36A. An advantage of this process is that copper germanide ($Cu_3Ge$) layer 22 can resist oxidation at temperatures over 500° C. in-air. In addition, it is possible to avoid copper (Cu) oxidation at the top corner of copper (Cu) lines and increase its reliability of the subsequent process steps as a result of this process of selective formation of copper germanide ($Cu_3Ge$) layer 22.

Figure 2A:
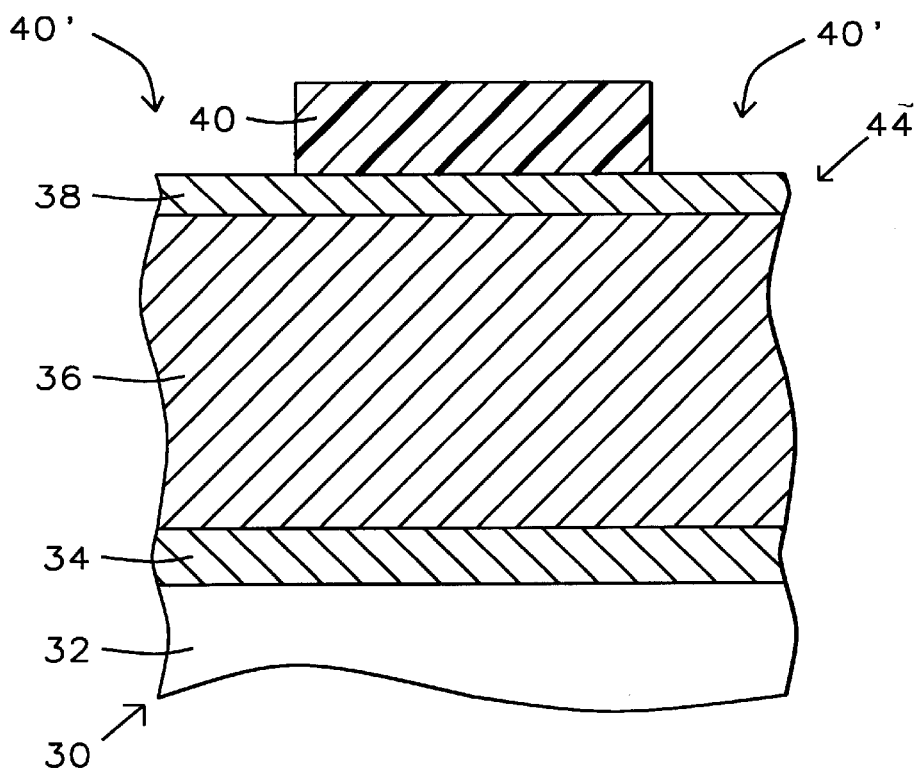
FIGS. 2A–2C show a sectional view of a device in the course of manufacture in accordance with an alternative embodiment of the method of this invention.
Figure 2B:
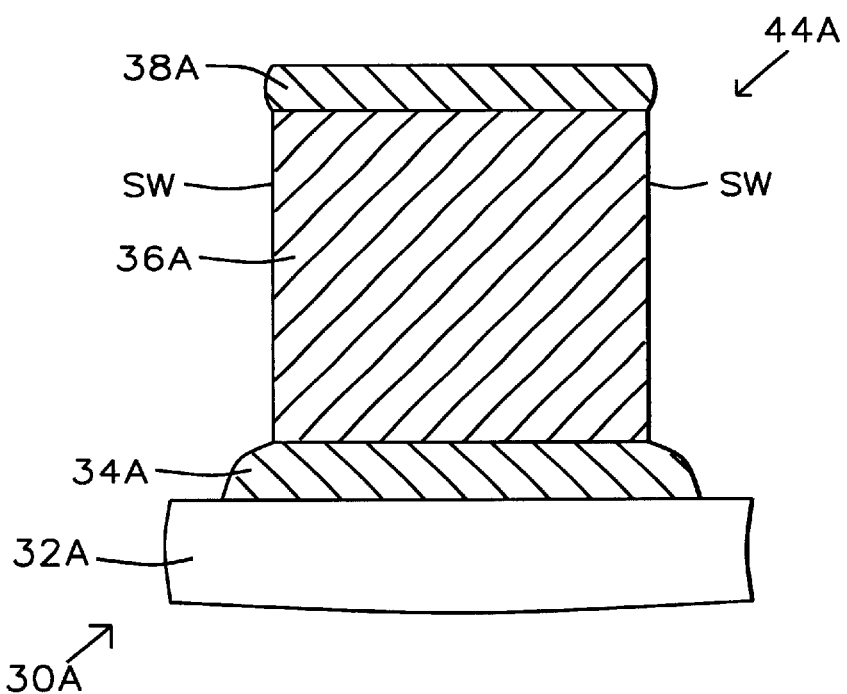
Figure 2C:
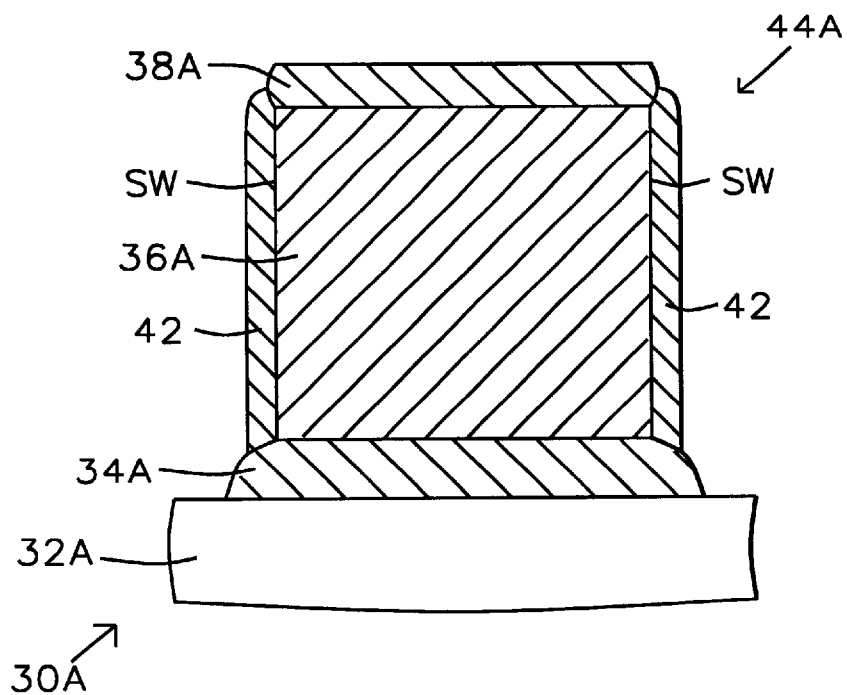

FIGS. 2A–2C show a sectional view of a device in the course of manufacture in accordance with an alternative embodiment of the method of this invention.

In FIG. 2A, device 30 in accordance with this invention is shown in an intermediate stage of manufacture with a substrate 32. A barrier layer 34 has been formed superjacent to substrate 32 (i.e. covering the top surface of substrate 32). The barrier layer 34 comprises a material selected from the group consisting of Ta, Ta/TaN, TaN, Ta/TaN/Ta, TaN/Ta, $WN_x$, W, and TiN.

A copper metal conductor layer 36 is formed superjacent to the barrier layer 34. Over the top surface of the metal conductor layer 36, a hard mask layer 38 is formed. A photoresist mask 40 is formed superjacent to the hard mask layer 38 a material selected from the group consisting of Ta, Ta/TaN, TaN, Ta/TaN/Ta, TaN/Ta, $WN_x$, W, and TiN.

Mask 40 is patterned with openings 40' provided for etching the stack 44 of layers 34/36/38. Thus the hard mask 38 (e.g. Ta) has been used in patterning the copper (Cu) layer 36 to form copper line 36A.

FIG. 2B shows the device 30 of FIG. 2A with the conductor stack 24A of the three layers 34/36/38 of FIG. 2A after patterning by a conventional etching process using the mask 40 to protect the stack 24A formed, as seen in FIG. 2B. Then subsequent to etching, the mask 40 was stripped (removed) from the device 30. During the etching process all the material from layers 34/36/38 is removed below the windows 40' patterning layers 34/36/38 to leave a laminated conductor line 24A formed by barrier layer 34A/conductor line 36A/mask layer 38A.

The problem is that the copper layer 36A now has exposed sidewalls SW which are likely to be oxidized which can reduce the reliability of the copper conductor line 36A. Thus it is necessary to passivate the copper sidewalls SW.

FIG. 2C shows the device 30 of FIG. 2B with the sidewalls SL coated with a copper germanide $Cu_3Ge$ compound passivation layer 42. This structure uses selective growth of passivation layer 42 on the sidewalls SW of copper layer 36A to avoid Copper (Cu) oxidation at the top corner of copper germanide ($Cu_3Ge$) compound passivation of lines 44A and to increase the reliability thereof by the subsequent process. As can be seen, the formation of copper germanide compound passivation layer 42 is selective in that layer 42 is not formed on the surface of the barrier layer 34A or the hard mask layer 38A.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A copper conductor line formed into a stack over a substrate comprising:

a barrier layer superjacent to said substrate, a copper layer superjacent to said barrier layer, a hard mask layer superjacent to said copper layer, said hard mask layer, said copper layer and said barrier layer patterned into a copper conductor line with sidewalls on said copper conductor line, and a copper germanium thin film as a passivation layer selectively grown only on said sidewalls of said copper conductor line.

2. The device of claim 1, wherein:

said copper germanium thin film comprises a copper germanide ($Cu_3Ge$) compound, as a passivation layer.

3. The device of claim 1, wherein:

said barrier layer comprises a material selected from the group consisting of Ta, Ta/TaN, TaN, Ta/TaN/Ta, TaN/Ta, $WN_x$, W, and TiN, and said copper germanium thin film comprises a copper germanide ($Cu_3Ge$) compound, as a passivation layer.

4. The device of claim 3, wherein:

said barrier layer comprises a material selected from the group consisting of Ta, Ta/TaN, TaN, Ta/TaN/Ta, TaN/Ta, $WN_x$, W, and TiN, and said hard mask layer comprises a material selected from the group consisting of Ta, Ta/TaN, TaN, Ta/TaN/Ta, TaN/Ta, $WN_x$, W, and TiN.

5. The device of claim 1, wherein:

said barrier layer comprises a material selected from the group consisting of Ta, Ta/TaN, TaN, Ta/TaN/Ta, TaN/Ta, $WN_x$, W, and TiN.

6. A copper conductor line formed into a stack over a substrate comprising:

a barrier layer superjacent to said substrate, a copper layer superjacent to said barrier layer, a hard mask layer superjacent to said copper layer, said hard mask layer, said copper layer and said barrier layer patterned into a copper conductor line with sidewalls on said copper conductor line, and a copper germanide ($Cu_3Ge$) passivation layer selectively grown only on said sidewalls of said copper conductor line.

7. The device of claim 6, wherein:

said barrier layer comprises a material selected from the group consisting of Ta, Ta/TaN, TaN, Ta/TaN/Ta, TaN/Ta, $WN_x$, W, and TiN.

8. The device of claim 6, wherein:

said barrier layer comprises a material selected from the group consisting of Ta, Ta/TaN, TaN, Ta/TaN/Ta, TaN/Ta, $WN_x$, W, and TiN, and said hard mask layer comprises a material selected from the group consisting of Ta, Ta/TaN, TaN, Ta/TaN/Ta, TaN/Ta, $WN_x$, W, and TiN.

* * * * *